US012568587B2

(12) United States Patent
Su et al.

(10) Patent No.: US 12,568,587 B2
(45) Date of Patent: Mar. 3, 2026

(54) CONNECTION METHOD FOR YARN WIRE AND CIRCUIT BOARD

(71) Applicant: NEXTRONICS ENGINEERING CORP., New Taipei City (TW)

(72) Inventors: Hou-An Su, Keelung City (TW); Kuan-Wen Chen, New Taipei City (TW)

(73) Assignees: NEXTRONICS ENGINEERING CORP., New Taipei City (TW); MAKALOT INDUSTRIAL CO., LTD., Taipei City (TW)

( * ) Notice: Subject to any disclaimer, the term of this patent is extended or adjusted under 35 U.S.C. 154(b) by 281 days.

(21) Appl. No.: 18/488,053

(22) Filed: Oct. 17, 2023

(65) Prior Publication Data

US 2025/0056734 A1 Feb. 13, 2025

(30) Foreign Application Priority Data

Aug. 9, 2023 (TW) .................................. 112129865

(51) Int. Cl.
H05K 3/32 (2026.01)
H01R 12/63 (2011.01)
(52) U.S. Cl.
CPC ............... H05K 3/32 (2013.01); H01R 12/63 (2013.01)

(58) Field of Classification Search
CPC . H05K 3/32; H01R 12/63; H01R 4/70; H01R 43/00
See application file for complete search history.

(56) References Cited

U.S. PATENT DOCUMENTS

2002/0137365 A1* 9/2002 McGrath .............. H01R 43/007
439/71
2019/0075652 A1* 3/2019 Nakajima ............ A61B 5/0205

FOREIGN PATENT DOCUMENTS

CN 216514461 U * 5/2022

* cited by examiner

*Primary Examiner* — George R Koch
(74) *Attorney, Agent, or Firm* — Li & Cai Intellectual Property Office

(57) ABSTRACT

A connection method for a yarn wire and a circuit board includes steps as follows: providing at least one yarn wire, a back adhesive, and a circuit board, at least one through hole is formed on the circuit board, and a diameter D of the through hole, a diameter d of the at least one yarn wire, a shrunken diameter $d_{min}$ of the yarn wire being stretched, and a jig thickness t of a jig have a relation of: $2d>D>2d_{min}+t$; placing the yarn wire on the back adhesive, aligning the yarn wire having the back adhesive with the through hole, and extruding and passing the yarn wire through the through hole by using the jig to penetrate the back adhesive; pulling the jig out along a pulling direction; and adhering a fixing back adhesive to one side of the circuit board.

9 Claims, 9 Drawing Sheets providing a yarn wire, a back adhesive, and a flexible circuit board, a through hole is formed on the flexible circuit board, a diameter of the through hole is defined as D, a diameter of the yarn wire is defined as d, a shrunken diameter of the yarn wire being stretched is defined as $d_{min}$, and a jig thickness of a jig is defined as t to have a relation of: $2d > D > 2d_{min} + t$ placing the yarn wire on the back adhesive, aligning the yarn wire with the through hole of the flexible circuit board, and using the jig to penetrate through the back adhesive so that the yarn wire is extruded into and passes through the through hole pulling the jig out, the yarn wire applies a frictional force and an abutting normal force on an inner wall of a periphery of the through hole, and a portion of the yarn wire that passes through the through hole forms a protruding wire segment that is expanded adhering a fixing back adhesive to one side of the flexible circuit board, the fixing back adhesive is adhered to the flexible circuit board and the protruding wire segment so that the yarn wire and the circuit board are connected and fixed to each other

FIG. 1

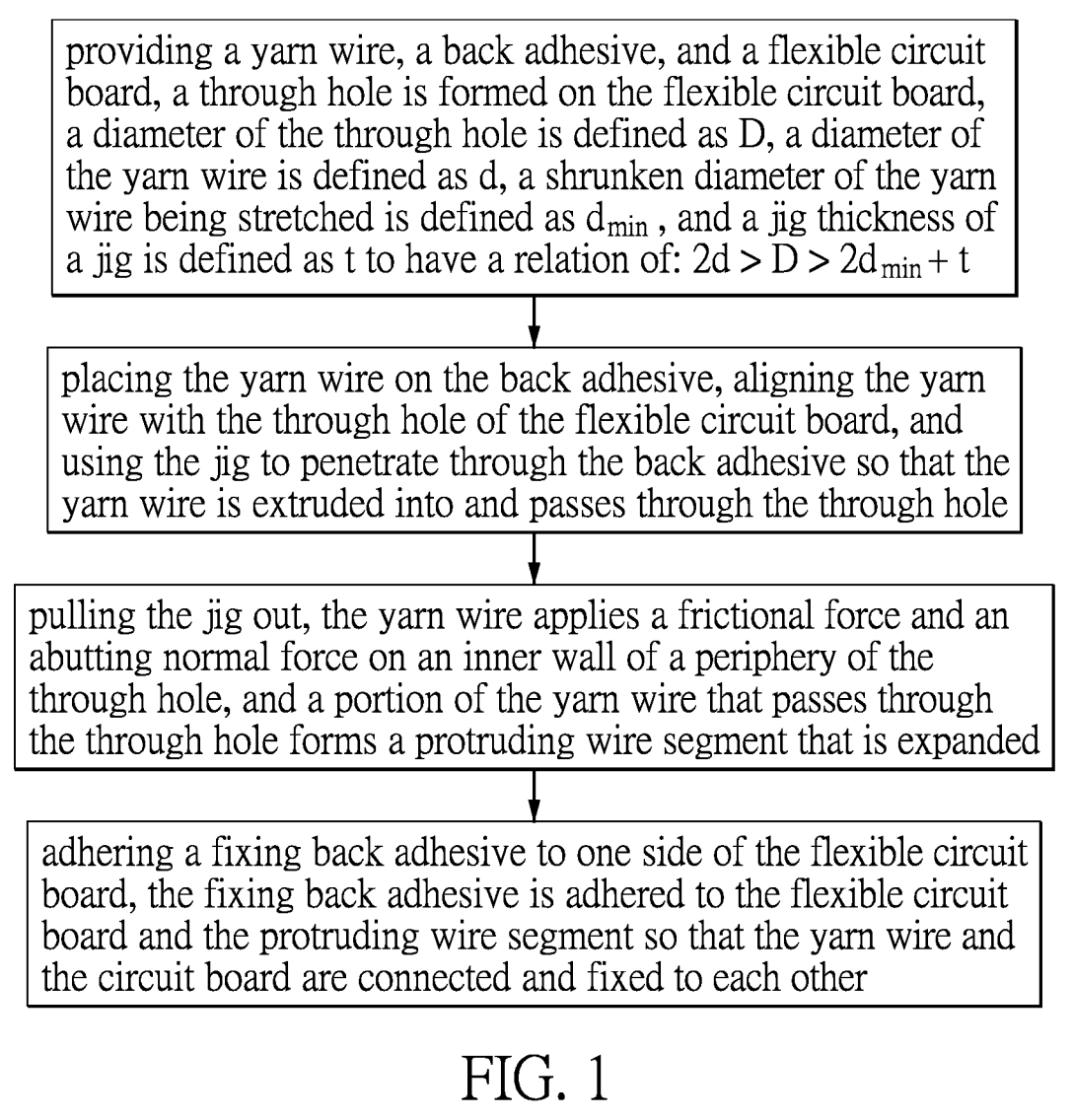

CONNECTION METHOD FOR YARN WIRE AND CIRCUIT BOARD

CROSS-REFERENCE TO RELATED PATENT APPLICATION

This application claims the benefit of priority to Taiwan Patent Application No. 112129865, filed on Aug. 9, 2023. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a connecting method of a yarn and a circuit board, and more particularly to a connecting method that enables a yarn and a circuit board to be connected for electrical signal transmission.

BACKGROUND OF THE DISCLOSURE

A yarn wire is made of a yarn and a metal wire twisted in a helical manner, and has the characteristics of being stretchable and electrically conductive at the same time. The yarn wire can be used as a means of connecting to a device, and the device can then be disposed on a circuit board to form a system that is stretchable and can transfer electrical signals. When the yarn wire is applied to fabrics, signals from various parts of the body can be transmitted to a device hub for processing, without the stretchable properties of the fabric being lost. Generally, the transmission of electrical signals is achieved by welding that includes adding a metal dielectric material between electrical conductors to transmit the electrical signals. However, the yarn itself is not resistant to high temperatures, so that new connection manners need to be developed for the electrical signals to be transmitted under such conditions.

SUMMARY OF THE DISCLOSURE

In response to the above-referenced technical inadequacies, the present disclosure provides a connection method for a yarn wire and a circuit board so that the yarn wire and the circuit board can be fixed and electrically conductive. Furthermore, the connection structure does not use a solder such that the connection structure can be eco-friendly, and the connection structure can be applied to process a material that is not resistant to high temperatures (such as the temperature of the solder).

In order to solve the above-mentioned problems, one of the technical aspects adopted by the present disclosure is to provide a connection method for a yarn wire and a circuit board including steps of: providing at least one yarn wire, a back adhesive, and a circuit board, in which at least one through hole penetrates through two opposite sides of the circuit board, a diameter of the through hole is defined as D, a diameter of the at least one yarn wire is defined as d, a shrunken diameter of the yarn wire being stretched is defined as $d_{min}$, and a jig thickness of a jig is defined as t, and the diameter of the through hole, the diameter of the at least one yarn wire, the shrunken diameter of the yarn wire being stretched, and the jig thickness have a relation of: $2d>D>2d_{min}+t$; placing the at least one yarn wire on the back adhesive so that the back adhesive is disposed on one side of the yarn wire, aligning the yarn wire with the through hole of the circuit board, and using the jig to penetrate through the back adhesive along an assembly direction so that the yarn wire is extruded into and passes through the through hole; pulling the jig out along a pulling direction, in which the yarn wire applies a frictional force and an abutting normal force on an inner wall of a periphery of the through hole, and a portion of the yarn wire that passes through the through hole forms a protruding wire segment in a shape of a round loop; and adhering a fixing back adhesive to one side of the circuit board, in which the fixing back adhesive is adhered to the circuit board and the protruding wire segment so that the yarn wire and the circuit board are connected and fixed to each other.

In one of the possible or preferred embodiments, the diameter of the yarn wire ranges from 0.5 mm to 0.7 mm, and the shrunken diameter of the yarn wire being stretched ranges from 0.2 mm to 0.4 mm.

In one of the possible or preferred embodiments, one end of the jig has a holding portion, and the holding portion is bifurcated. The holding portion includes two holding bars, and a retaining groove is formed between the two holding bars. The retaining groove can be used to accommodate the yarn wire, so that the two holding bars can be used to hold the yarn wire.

In one of the possible or preferred embodiments, a conductive adhesive is provided between the yarn wire and the circuit board to assist in fixing the yarn wire and the circuit board. That is, two pieces of adhesives are respectively heat-pressed on a top side and a bottom side of the circuit board (i.e., the back adhesive and the fixing back adhesive) to facilitate fixing the yarn wire to the circuit board.

Therefore, in the connection method for a yarn wire and a circuit board, a through hole is formed on the circuit board, and a diameter of the through hole D, a diameter of the yarn wire d, the shrunken diameter of the yarn wire being stretched $d_{min}$, and a jig thickness t of a jig have a relation of: $2d>D>2d_{min}+t$. At least one yarn wire is placed on the back adhesive, and the jig is used to penetrate through the back adhesive along an assembly direction so that the yarn wire is extruded into and passes through the through hole. When pulling the jig out along a pulling direction, the yarn wire applies a frictional force and an abutting normal force on an inner wall of a periphery of the through hole, and a portion of the yarn wire that passes through the through hole forms a protruding wire segment that is expanded and in a shape of a round loop to prevent the yarn wire from being pulled out with the jig. The fixing back adhesive is adhered to the circuit board and the protruding wire segment and enables the protruding wire segment to be more robust and difficult to be pulled out. Therefore, the yarn wire and the circuit board are connected and fixed to each other. The connection method for a yarn wire and a circuit board provided in the present disclosure allows the yarn wire and the circuit board to be fixed and electrically conductive, and the yarn wire and the circuit board can be rapidly and smoothly assembled. Furthermore, the connection method does not use a solder such that the connection method can be eco-friendly, and the connection method can be applied to process a material that does not resist a high temperature.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which:

FIG. 1 is a flowchart of a connection method for a yarn wire and a circuit board according to the present disclosure;

Figure 2:
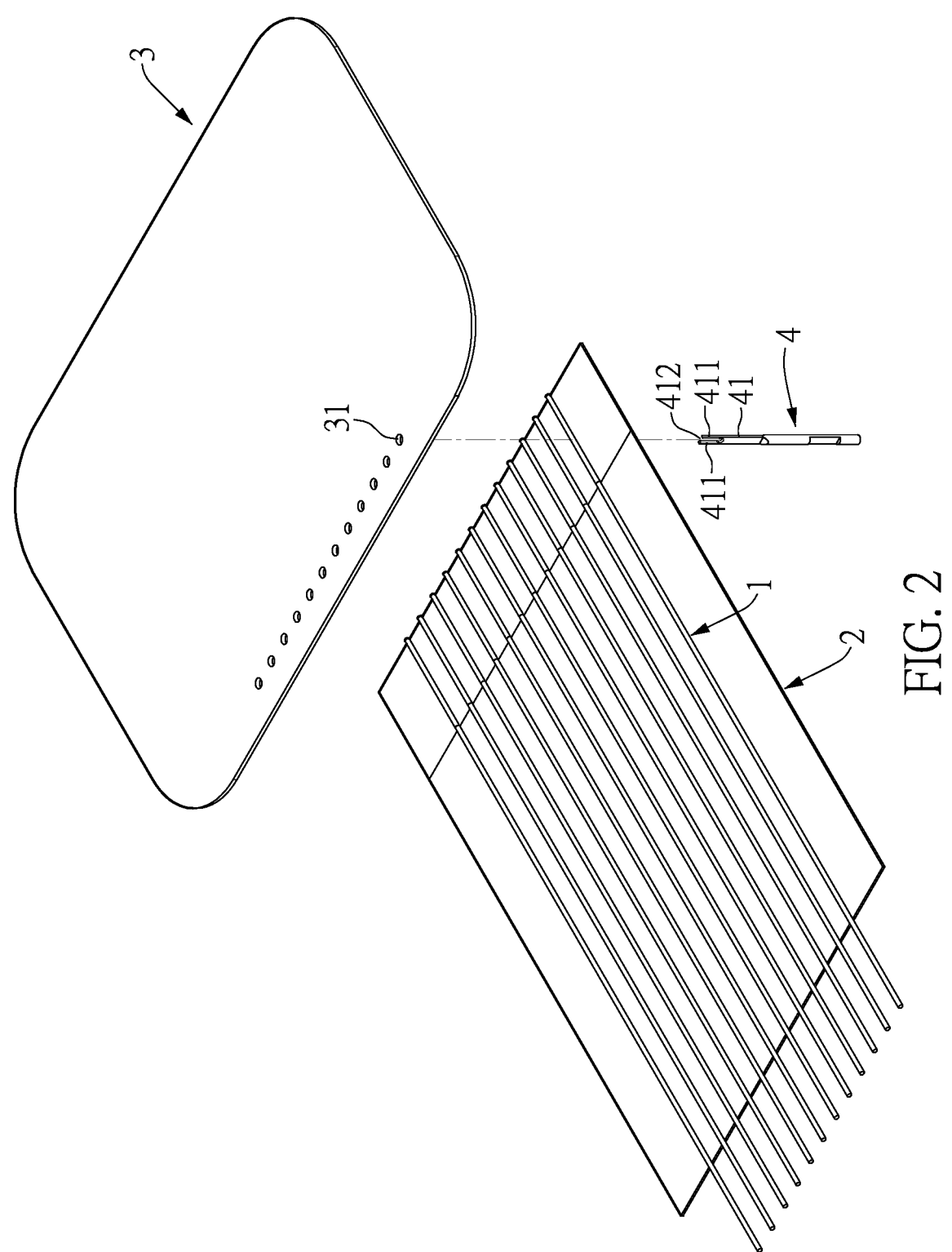
FIG. 2 is a schematic perspective exploded view of a yarn wire and a circuit board according to the present disclosure.

DETAILED DESCRIPTION OF THE
EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "sec-ond" or "third" can be used to describe various components, signals or the like, which are for distinguishing one component/signal from another one only, and are not intended to, nor should be construed to impose any substantive limitations on the components, signals or the like.

Embodiment

Referring to FIG. 1, the present disclosure provides a connection method for a yarn wire and a circuit board. The connection method includes the following steps.

Figure 3:
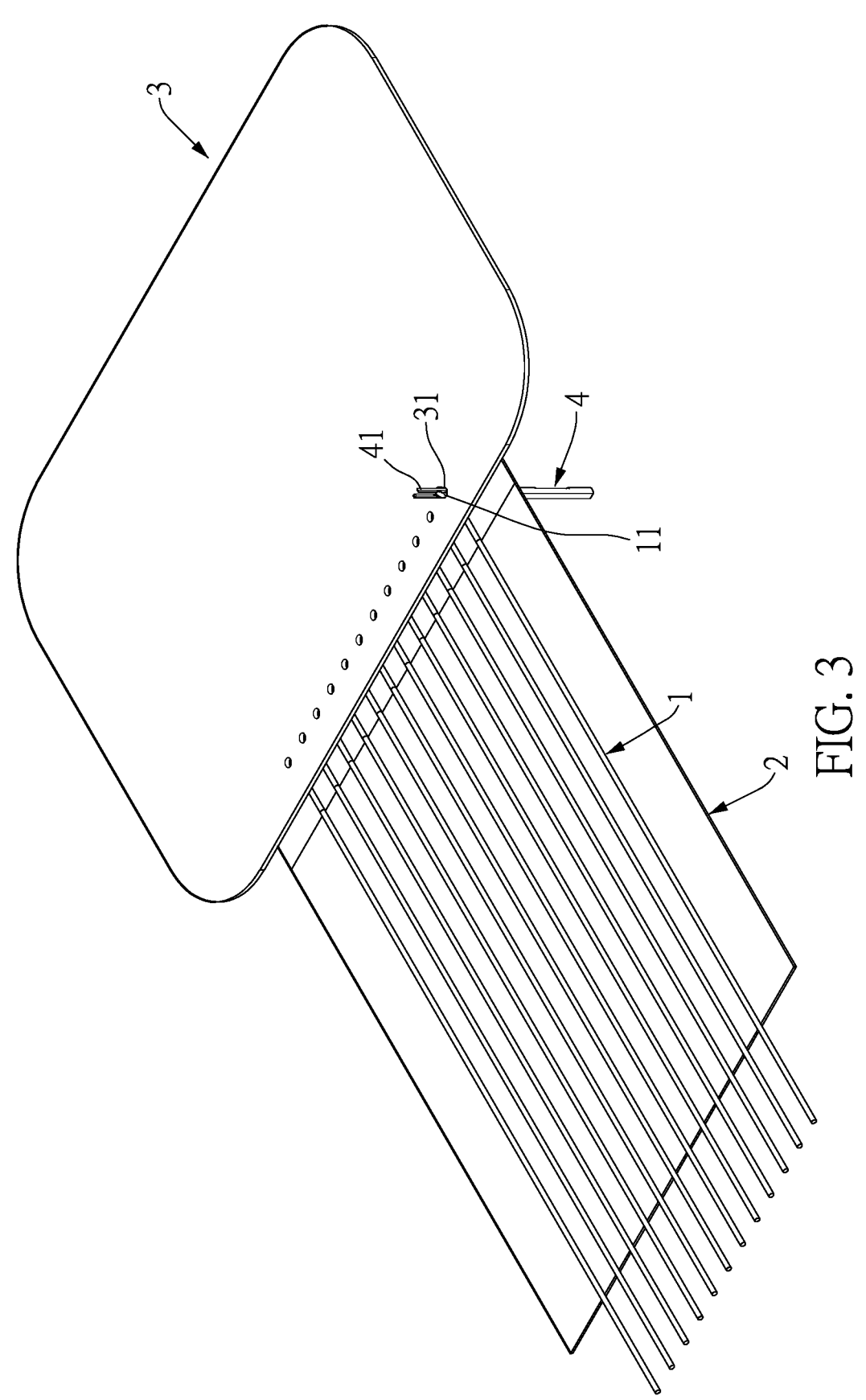
FIG. 3 is a schematic perspective assembly view of the yarn wire and the circuit board according to the present disclosure.
Figure 4:
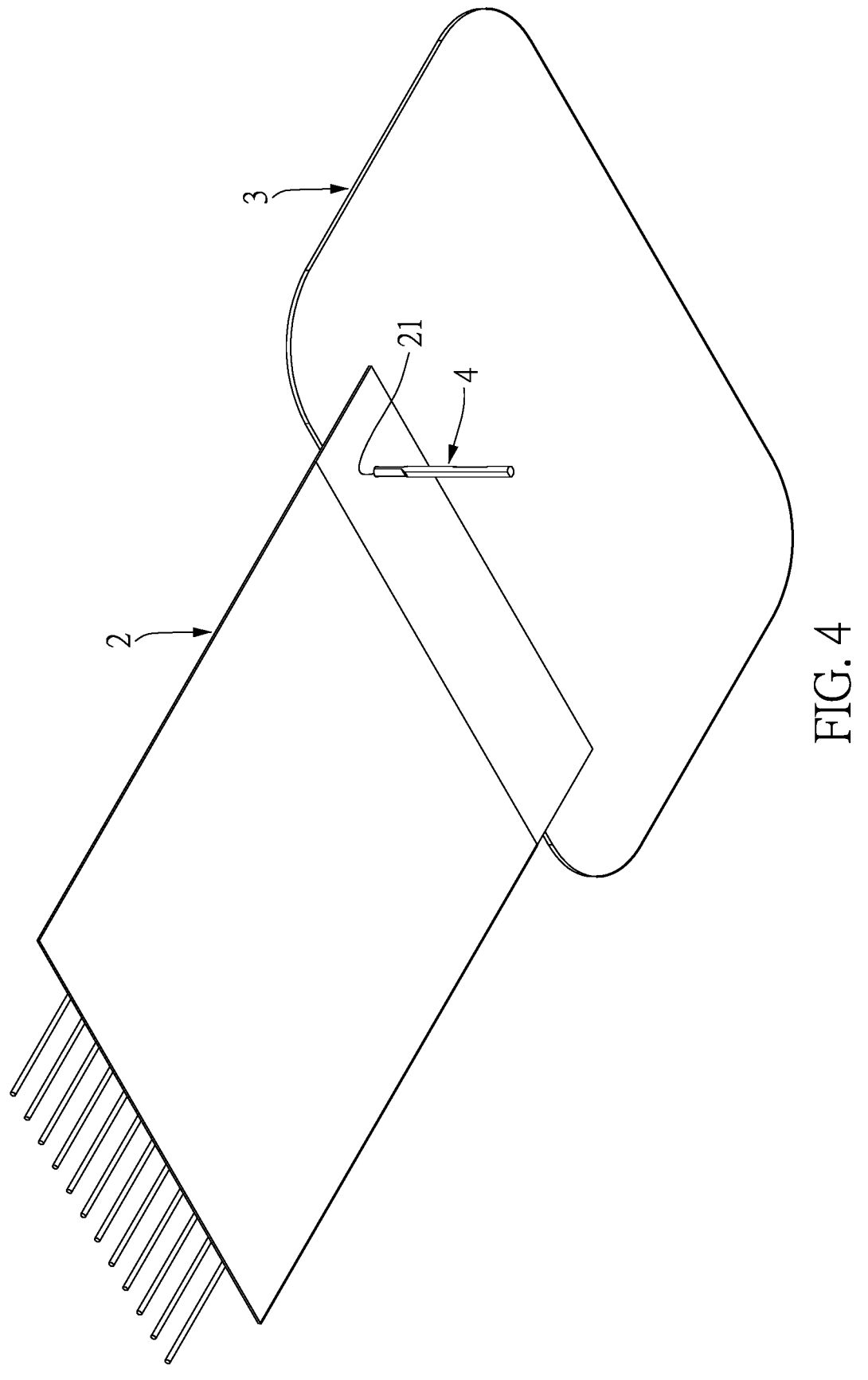
FIG. 4 is another schematic perspective assembly view of the yarn wire and the circuit board according to the present disclosure.

First, at least one yarn wire 1, a back adhesive 2, and a circuit board 3 (as shown in FIG. 2 to FIG. 4) are provided. The yarn wire 1 includes a yarn and a metal wire (not shown in the figures) that are helically twisted together. The yarn wire 1 is a stretchable and electrically conductive yarn wire structure that has properties of being stretchable and electrically conductive. Since the yarn wire is an existing technology and the present disclosure does not limit a structure of the yarn wire 1, the structure of the yarn wire 1 will not be described in detail herein. A quantity of the yarn wire 1 is not limited, and a quantity of the yarn wire 1 can be one or more. In this embodiment, a plurality of yarn wires 1 are provided to allow for greater signal transmission. The yarn wires 1 are spaced apart from each other.

The back adhesive 2 is elastic, and the back adhesive 2 is in a gel state and becomes sticky when coming in contact with heat, such that the back adhesive 2 can be bonded with the yarn wires 1 for being press-printed on fabrics. Therefore, the fabrics can provide an electrical signal transmission function while maintaining the stretchable characteristic. The circuit board 3 is a flexible circuit board suitable for being used in an environment without specific support.

Figure 5:
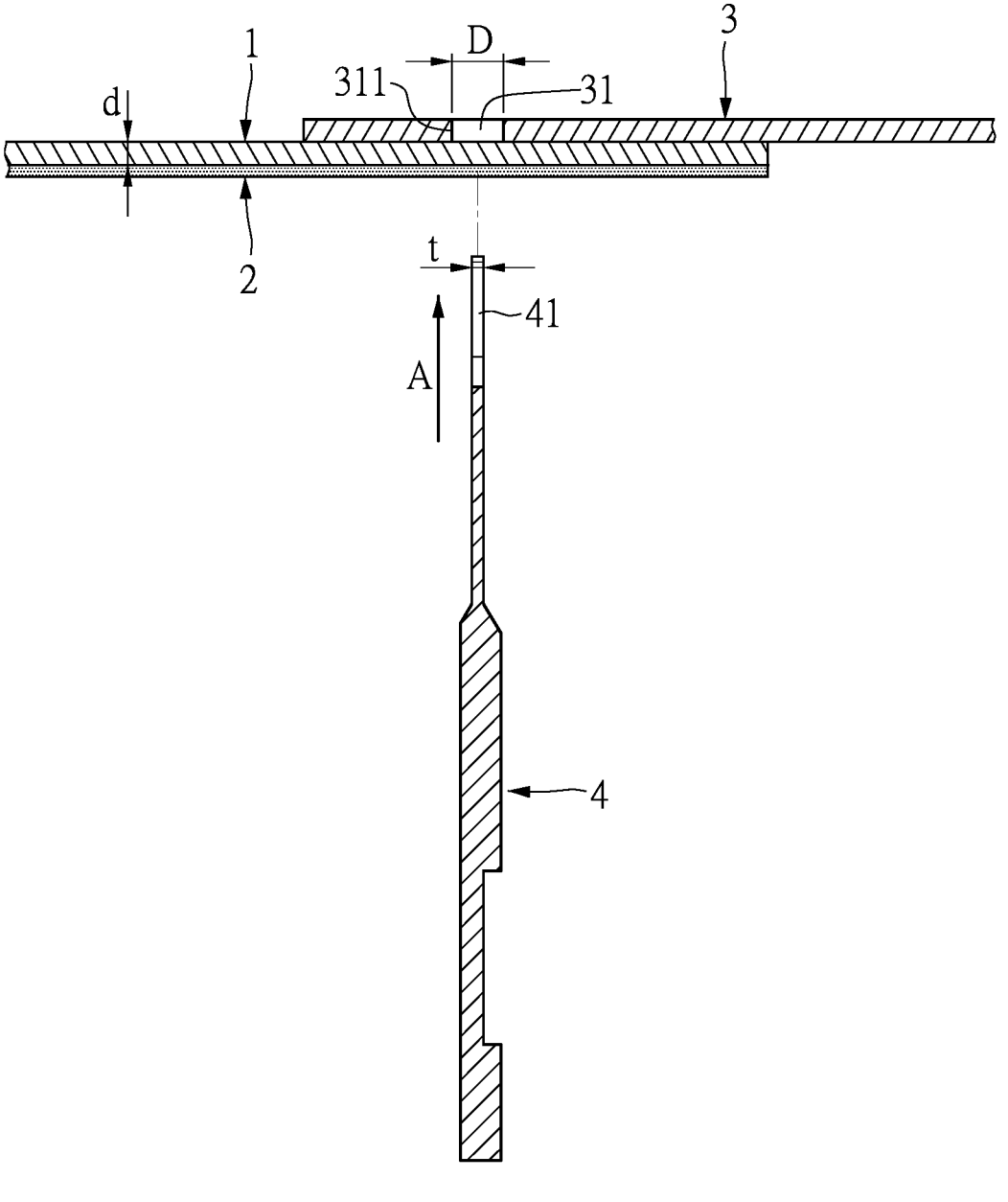
FIG. 5 is a schematic view of a step of the connection method for a yarn wire and a circuit board according to the present disclosure.
Figure 6:
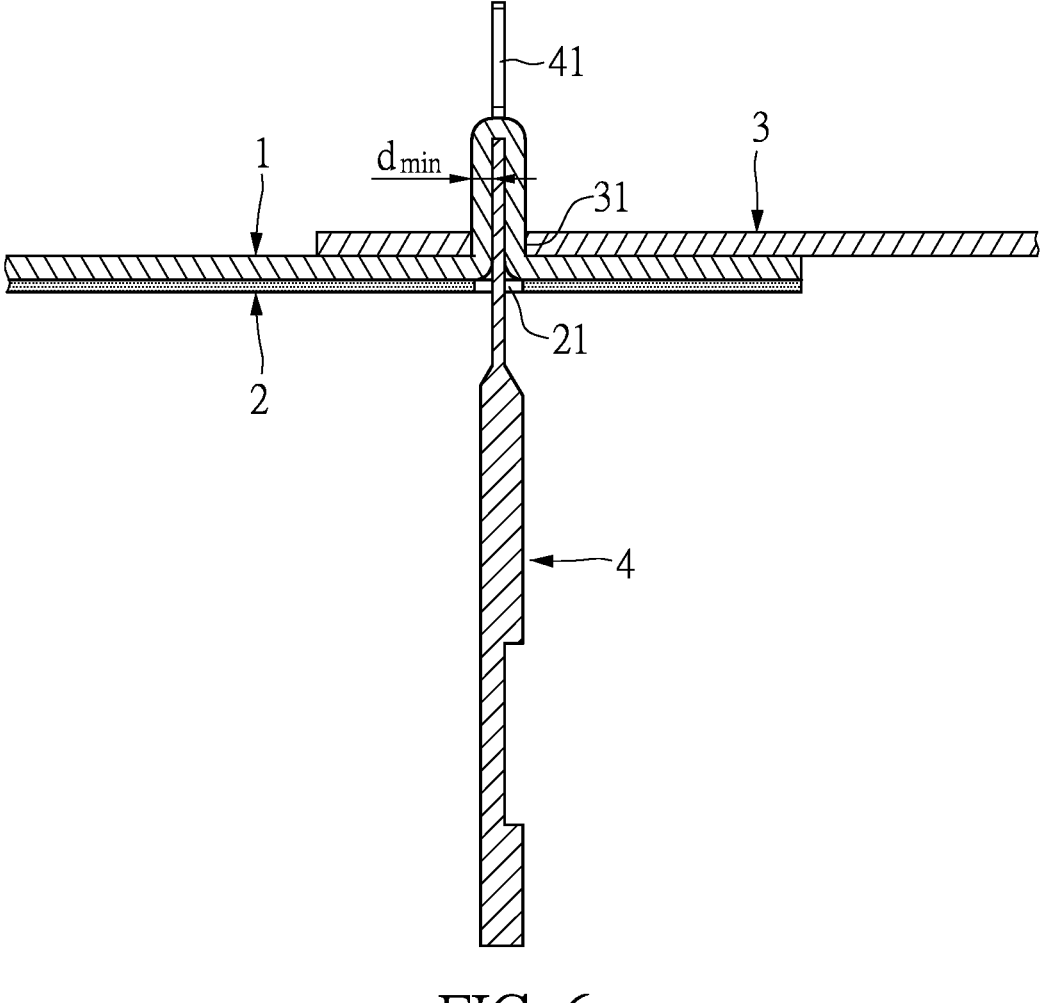
FIG. 6 is a schematic view of another step of the connection method for a yarn wire and a circuit board according to the present disclosure.

The circuit board 3 can be a flexible or a rigid circuit board. At least one through hole 31 is formed on the circuit board 3. The through hole 31 is a circular hole, and the through hole 31 penetrates through two opposite sides of the circuit board 3. A number of the through hole 31 is not limited, and the number of the through hole 31 can be one or more. Multiple through holes 31 are formed in this embodiment, and the through holes 31 are spaced apart from each other and respectively correspond with the yarn wires 1. The through holes 31 can be arranged in one row to facilitate connection with the yarn wires 1 and fixing the yarn wires 1 in place. A diameter of the through hole 31 is defined as D (as shown in FIG. 5), a diameter of the at least one yarn wire 1 is defined as d, a shrunken diameter of the yarn wire 1 being stretched is defined as $d_{min}$ (as shown in FIG. 6), and a jig thickness (as shown in FIG. 5) of a jig 4 is defined as t. The diameter of the through hole 31, the diameter of the at least one yarn wire 1, the shrunken diameter of the yarn wire 1 being stretched, and the jig thickness have a relation of: $2d > D > 2d_{min} + t$. The present disclosure provides an optimal correspondence between the diameter d of the at least one yarn wire 1, the shrunken diameter $d_{min}$ of the yarn wire 1 being stretched, and the diameter D of the through hole 31. Preferably, the diameter d of the yarn wire 1 ranges from 0.5 mm to 0.7 mm, and more preferably is 0.6 mm, and the shrunken diameter $d_{min}$ of the shrunken diameter of the yarn wire 1 being stretched ranges from 0.2 mm to 0.4 mm, and more preferably is 0.3 mm. Therefore, the yarn wire 1 and the circuit board 3 can be smoothly connected and fixed to each other, and have a steady connection therebetween, but the present disclosure is not limited thereto.

Afterwards, the yarn wire 1 is arranged on the back adhesive 2 (as shown in FIG. 5). At this time, the back adhesive 2 is disposed on one side of the yarn wire 1. The yarn wire 1 having the back adhesive 2 is aligned with the through hole 31 of the circuit board 3. The jig 4 is used to penetrate through the back adhesive 2 along an assembly direction A so that a portion of the yarn wire 1 is extruded into and passes through the through hole 31 (as shown in FIG. 6). The assembly direction A is preferably perpendicular to one side of the back adhesive 2 away from the yarn wire 1. At least one perforation 21 can be formed on the back adhesive 2, and the perforation 21 corresponds to the through hole 31. The perforation 21 allows the jig 4 to penetrate the back adhesive 2, and the perforation 21 can be formed when the jig 4 penetrates the back adhesive 2, or formed beforehand. A diameter of the yarn wire 1 is decreased as the yarn wire 1 is stretched. The shrunken diameter of the yarn wire 1 being stretched is defined as $d_{min}$. In this way, the yarn wire 1 can pass through the through hole 31 more easily.

In this embodiment, one end of the jig 4 has a holding portion 41. The holding portion 41 is bifurcated and can be used to quickly hold the yarn wire 1 to squeeze the yarn wire 1 into the through hole 31, and the holding portion 41 can also be rapidly separated from the yarn wire 1. Preferably, the holding portion 41 includes two holding bars 411 (as shown in FIG. 2), and a retaining groove 412 is formed between the two holding bars 411. The retaining groove 412 can be used to accommodate the yarn wire 1, so that the two holding bars 411 can be used to hold the yarn wire 1, thereby allowing the holding portion 41 to quickly hold the yarn wire 1 or be quickly separated from the yarn wire 1. The circuit board 3 can be partially laminated with the back adhesive 2 such that the circuit board 3 is bonded by adhesion to the back adhesive 2 to have an improved fixing effect.

Figure 7:
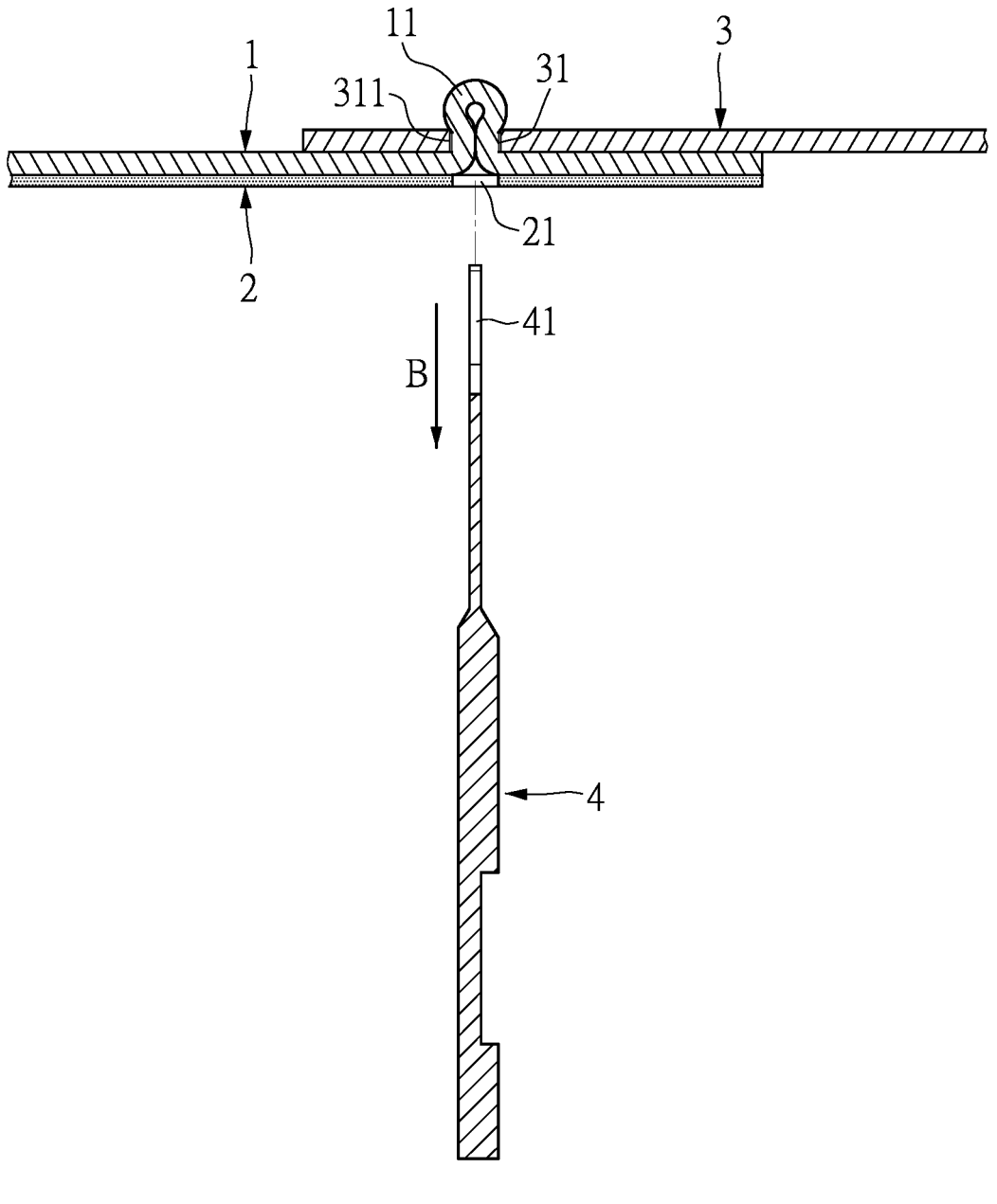
FIG. 7 is a schematic view of yet another step of the connection method for a yarn wire and a circuit board according to the present disclosure.
Figure 8:
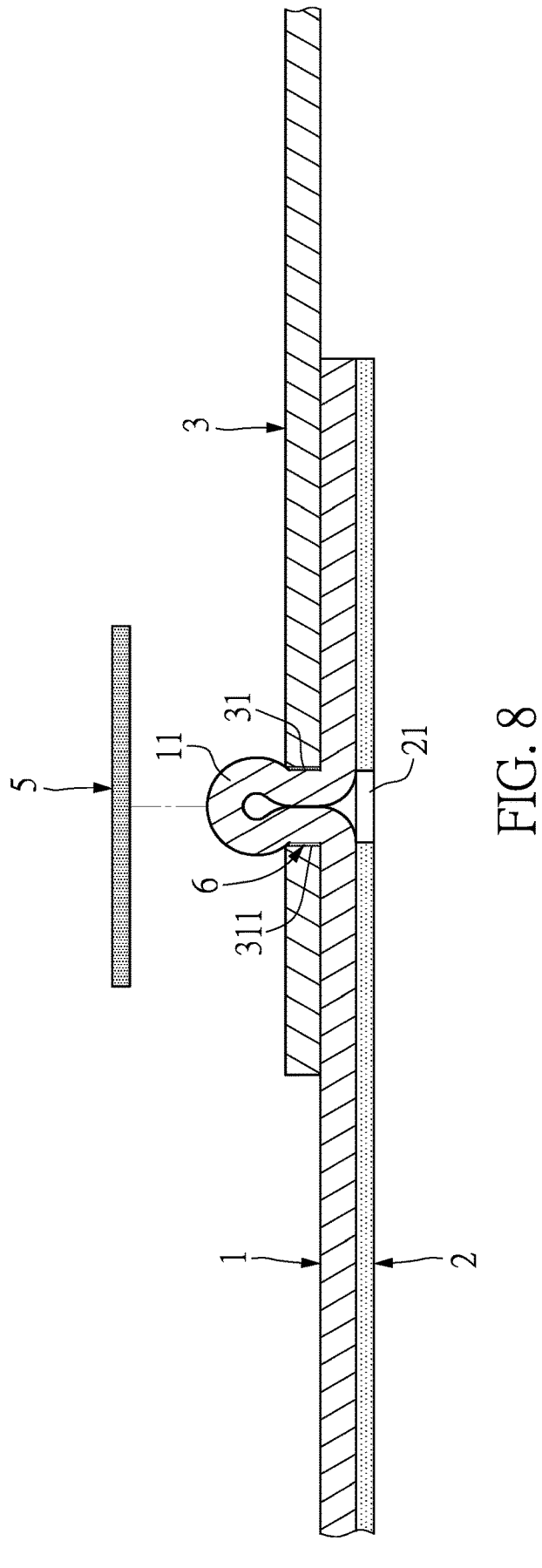
FIG. 8 is a schematic view of still another step of the connection method for a yarn wire and a circuit board according to the present disclosure.

The jig 4 is then pulled out along a pulling direction B (as shown in FIG. 7), the pulling direction B and the assembly direction A may be two opposite directions to facilitate the removal of the jig 4, and the pulling direction B is preferably perpendicular to one side of the back adhesive 2 away from the yarn wire 1. At this time, the yarn wire 1 recovers and expands due to the stretching being stopped, and the yarn wire 1 applies a frictional force and an abutting normal force on an inner wall 311 of a periphery of the through hole 31. Furthermore, the portion of the yarn wire 1 that passes through the through hole 31 forms a protruding wire segment 11 that is expanded and forms a circular hole so as to provide a fixing effect. The protruding wire segment 11 can be loop-shaped (as shown in FIG. 7 and FIG. 8). The protruding wire segment 11 can prevent the yarn wire 1 from being pulled out together with the jig 4.

Furthermore, glue can be dispensed between the yarn wire 1 and the circuit board 3. That is, an electrically conductive adhesive 6 (e.g., a conductive silver glue) can be disposed between the yarn wire 1 and the circuit board 3 to assist in fixing the yarn wire 1 and the circuit board 3 together, so that the yarn wire 1 and the circuit board 3 can have an improved electrical conduction and an improved fixing effect.

Finally, a fixing back adhesive 5 can be adhered to one side of the circuit board 3 (as shown in FIG. 8) by way of heat-pressing. The fixing back adhesive 5 is adhered to the circuit board 3 and the protruding wire segment 11 to enable the protruding wire segment to be more rigid and difficult to be pulled out. Therefore, the yarn wire 1 and the circuit board 3 are fixedly connected to each other and achieve an electrical connection, and the metal wire of the yarn wire 1 can be in contact with the circuitry of the circuit board 3 to achieve the electrical connection. The back adhesive 2 can also be adhered to the yarn wire 1 and the circuit board 3 by way of heat-pressing. Two pieces of adhesives are respectively heat-pressed on a top side and a bottom side of the circuit board 3 (i.e., the back adhesive 2 and the fixing back adhesive 5) to facilitate fixing the yarn wire 1 to the circuit board 3.

Figure 9:
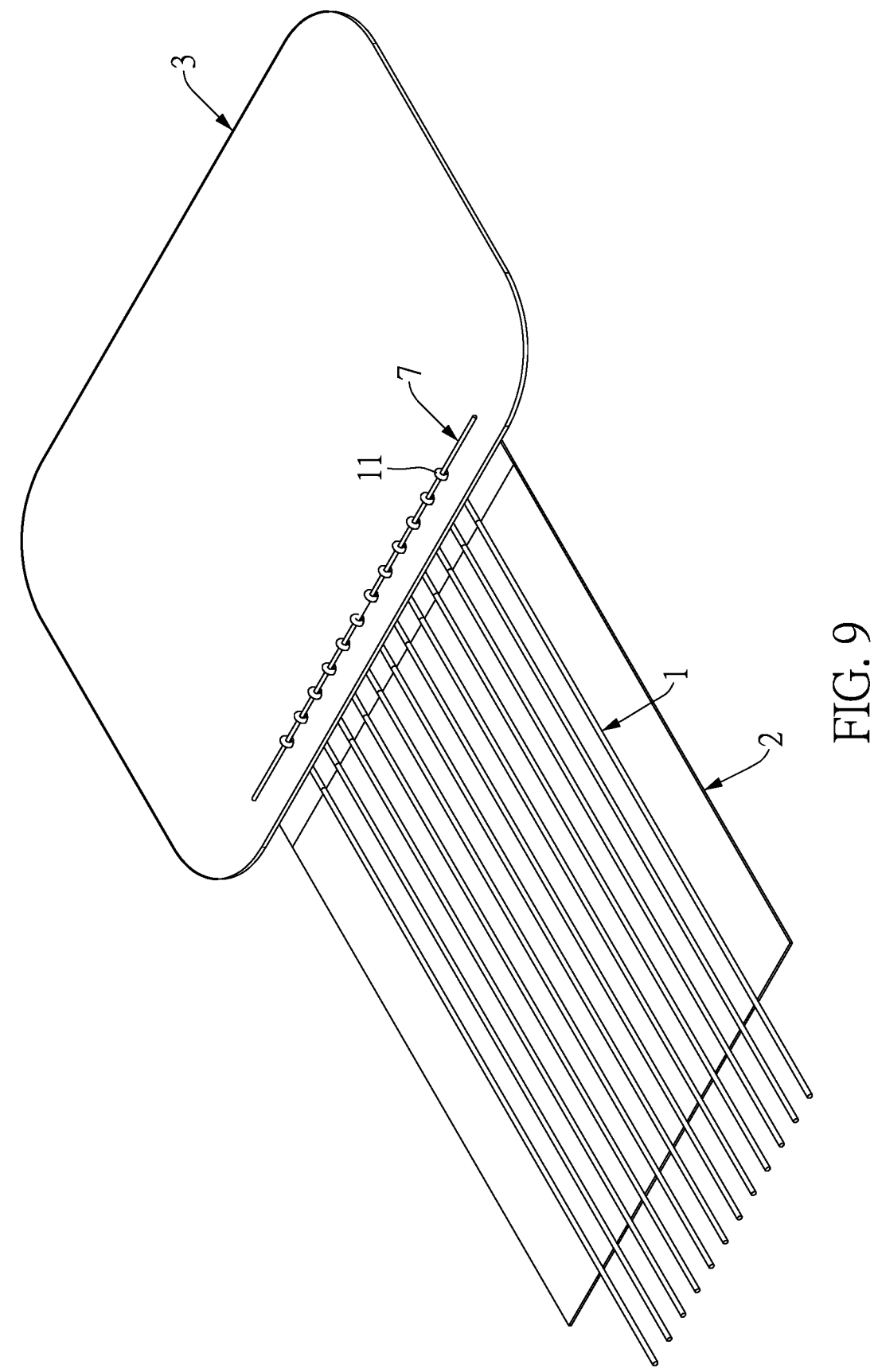
FIG. 9 is a schematic perspective assembly view of the yarn wire and the circuit board according to the present disclosure.

In addition, as shown in FIG. 9, this embodiment provides another structure for fixing the protruding wire segment 11. After a portion of the yarn wire 1 passes through the through hole 31 of the circuit board 3 to form the protruding wire segment 11, an insulating wire 7 (e.g., a plastic wire) penetrates into a side of the protruding wire segment 11. The insulating wire 7 passes through the center of the protruding wire segment 11 having the round looped shape as an anti-pulling support line to prevent the protruding wire segment 11 from being pulled out. Therefore, the yarn wire 1 and the circuit board 3 are fixedly connected to each other and achieve an electrical connection.

Beneficial Effects of the Embodiment

Therefore, in the connection method for a yarn wire and a circuit board, a through hole is formed on the circuit board, and a diameter of the through hole D, a diameter of the yarn wire d, the shrunken diameter of the yarn wire being stretched $d_{min}$, and a jig thickness t of a jig have a relation of: $2d>D>2d_{min}+t$. The at least one yarn wire is placed on the back adhesive, and the jig is used to penetrate through the back adhesive along an assembly direction so that the yarn wire is extruded into and passes through the through hole. When pulling the jig out along a pulling direction, the yarn wire applies a frictional force and an abutting normal force on an inner wall of a periphery of the through hole, and a portion of the yarn wire that passes through the through hole forms a protruding wire segment that is expanded and in a shape of a round loop to prevent the yarn wire from being pulled out with the jig. The fixing back adhesive is adhered to the circuit board and the protruding wire segment and enables the protruding wire segment to be more robust and difficult to be pulled out. Therefore, the yarn wire and the circuit board are connected and fixed to each other. The connection method for a yarn wire and a circuit board provided in the present disclosure allows the yarn wire and the circuit board to be fixed and electrically conductive, and the yarn wire and the circuit board can be rapidly and smoothly assembled. Furthermore, the connection method does not use a solder such that the connection method can be eco-friendly, and the connection method can be applied to process a material that does not resist a high temperature.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A connection method for a yarn wire and a circuit board, comprising processes of:
   providing at least one yarn wire, a back adhesive layer, and a circuit board; wherein the circuit board has a first side and a second side opposite to the first side, at least one through hole penetrates through the first side and the second side of the circuit board, wherein a diameter of the through hole is defined as D, an original diameter of the at least one yarn wire is defined as d;

providing a jig, wherein one end of the jig has a holding portion, the holding portion is plate-shaped and has a jig thickness of t, a width of the holding portion is smaller than the diameter of the through hole, the holding portion includes two holding bars and a retaining groove formed between the two holding bars; wherein the retaining groove is configured to accommodate the at least one yarn wire;

placing the at least one yarn wire on the back adhesive layer, aligning the yarn wire with the through hole of the circuit board, the back adhesive layer fixing the at least one yarn wire on the first side of the circuit board; and using the jig to penetrate through the back adhesive layer along an assembly direction such that the yarn wire is extruded into and passes through the through hole to extend beyond the second side of the circuit board, wherein the yarn wire is stretched and attached to both sides of the holding portion, and has a shrunken diameter dmin during stretching, wherein the diameter D of the through hole is greater than a sum of the jig thickness t of the holding portion and twice the shrunken diameter dmin;

pulling the jig out along a pulling direction, wherein the yarn wire applies a frictional force and an abutting normal force on an inner wall of a periphery of the through hole, and a portion of the yarn wire that passes through the through hole forms a protruding wire segment in a shape of a round loop; wherein the protruding wire segment of the yarn wire expands and is restored to the original diameter due to the stretching being stopped so that the diameter of the through hole, the original diameter of the at least one yarn wire, the shrunken diameter of the yarn wire being stretched, and the jig thickness have a relation of: 2d>D>2dmin+t; and adhering a fixing back adhesive to the second side of the circuit board, wherein the fixing back adhesive is adhered to the circuit board and the protruding wire segment so that the yarn wire and the circuit board are connected and fixed to each other.

2. The connection method according to claim 1, wherein the diameter of the yarn wire ranges from 0.5 mm to 0.7 mm, and the shrunken diameter of the yarn wire being stretched ranges from 0.2 mm to 0.4 mm.

3. The connection method according to claim 1, wherein at least one perforation is formed on the back adhesive layer, the perforation corresponds to the through hole, and the perforation allows the jig to penetrate through the back adhesive layer.

4. The connection method according to claim 1, wherein multiple ones of the yarn wires are provided, and the yarn wires are spaced apart from each other; wherein multiple ones of the through holes are formed, the through holes are spaced apart from each other, and the through holes are arranged in a row.

5. The connection method according to claim 1, wherein the assembly direction is perpendicular to one side of the back adhesive layer away from the yarn wire, and the pulling direction and the assembly direction are two opposite directions.

6. The connection method according to claim 1, wherein the yarn wire and the circuit board are electrically connected.

7. The connection method according to claim 1, wherein the circuit board is partially laminated with the back adhesive layer so that the circuit board is bonded by adhesion to the back adhesive layer.

8. The connection method according to claim 1, wherein the yarn wire is a stretchable and electrically conductive yarn wire structure.

9. The connection method according to claim 1, wherein an electrically conductive adhesive is disposed between the yarn wire and the circuit board, or an insulating wire penetrates into a side of the protruding wire segment to prevent the protruding wire segment from being pulled out.

* * * * *